(12) United States Patent
Yang et al.

(10) Patent No.: US 11,217,466 B2
(45) Date of Patent: Jan. 4, 2022

(54) WAFER PROCESSING METHOD AND CUTTING APPARATUS

(71) Applicant: DISCO CORPORATION, Tokyo (JP)

(72) Inventors: Yunfeng Yang, Tokyo (JP); Yuji Uemura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 39 days.

(21) Appl. No.: 16/989,132

(22) Filed: Aug. 10, 2020

(65) Prior Publication Data
US 2021/0050238 A1 Feb. 18, 2021

(30) Foreign Application Priority Data
Aug. 15, 2019 (JP) .............................. JP2019-149168

(51) Int. Cl.
*H01L 21/67* (2006.01)
*B28D 5/04* (2006.01)
*H01L 23/544* (2006.01)

(52) U.S. Cl.
CPC .......... *H01L 21/67282* (2013.01); *B28D 5/04* (2013.01); *H01L 23/544* (2013.01); *H01L 2223/54493* (2013.01)

(58) Field of Classification Search
CPC combination set(s) only.
See application file for complete search history.

(56) References Cited

U.S. PATENT DOCUMENTS 5,842,825 A * 12/1998 Brooks ............... H01L 21/6833
414/754

FOREIGN PATENT DOCUMENTS

JP 2013102080 A 5/2013

* cited by examiner

*Primary Examiner* — Quoc D Hoang
(74) *Attorney, Agent, or Firm* — Greer Burns & Crain Ltd.

(57) ABSTRACT

A wafer processing method includes preparing a holding table having a blade clearance portion formed therein so as to correspond to a notch of a wafer, holding the wafer by the holding table so as to make the notch of the wafer correspond to the blade clearance portion of the holding table, reducing the diameter of the wafer by cutting the wafer by a cutting blade along an outer peripheral edge of the wafer in a state in which an end of the cutting blade is positioned below the holding surface of the holding table and therefore removing at least a part of the notch portion, and forming a second notch in the wafer by cutting the wafer in a thickness direction by the cutting blade along the blade clearance portion of the holding table.

2 Claims, 7 Drawing Sheets

WAFER PROCESSING METHOD AND CUTTING APPARATUS

BACKGROUND OF THE INVENTION

Field of the Invention

The present invention relates to a wafer processing method and a cutting apparatus that reduce the diameter of a wafer forming a circular shape and having a notch formed by cutting away a part of an arc, by cutting the wafer along an outer peripheral edge of the wafer by a cutting blade.

Description of the Related Art

A wafer processing method is used which removes the entire circumference of an outer peripheral edge of a wafer from a top surface on which devices are formed to an undersurface (see Japanese Patent Laid-Open No. 2013-102080, for example).

SUMMARY OF THE INVENTION

However, when the entire circumference of the outer peripheral edge of the wafer is cut and removed from the top surface on which the devices are formed to the undersurface, a notch or an orientation flat indicating a crystal orientation disappears, so that the crystal orientation of the wafer cannot be detected, and thus, the wafer cannot be positioned in a predetermined orientation in a subsequent step.

It is accordingly an object of the present invention to provide a wafer processing method and a cutting apparatus that enable even a wafer cut along an outer peripheral edge of the wafer to be positioned in a predetermined orientation in a next step.

In accordance with an aspect of the present invention, there is provided a wafer processing method for reducing a diameter of a wafer forming a circular shape and having a first notch portion formed by cutting away a part of an arc, the first notch portion indicating a crystal orientation, by cutting the wafer along an outer peripheral edge of the wafer by a cutting blade, the wafer processing method including a holding table preparing step of preparing a holding table including a circular holding surface configured to hold the wafer and having a blade clearance portion formed in the holding table so as to correspond to the first notch portion of the wafer to be held, a holding step of holding the wafer by the holding table so as to make the first notch portion of the wafer correspond to the blade clearance portion of the holding table, after the holding table preparing step, the holding surface of the holding table having a diameter corresponding to the diameter of the wafer after diameter reduction, a diameter reducing step of reducing the diameter of the wafer by cutting the wafer by the cutting blade along the outer peripheral edge of the wafer in a state in which an end of the cutting blade is positioned below the holding surface of the holding table and therefore removing at least a part of the first notch portion, after the holding step is performed, and a notch portion forming step of forming a second notch portion in the wafer by cutting the wafer in a thickness direction by the cutting blade along the blade clearance portion of the holding table.

In accordance with another aspect of the present invention, there is provided a cutting apparatus for reducing a diameter of a wafer forming a circular shape and having a notch portion formed by cutting away a part of an arc, the notch portion indicating a crystal orientation, by cutting the wafer by a cutting blade along an outer peripheral edge of the wafer, the cutting apparatus including a holding table including a circular holding surface configured to hold the wafer, having a blade clearance portion formed in the holding table so as to correspond to the notch portion of the wafer to be held, and having a diameter corresponding to the diameter of the wafer after diameter reduction, a rotary mechanism configured to rotate the holding table about a rotational axis passing through a center of the holding surface, a cutting unit including the cutting blade configured to cut the wafer held on the holding table and a spindle having the cutting blade mounted on an end of the spindle, and a moving mechanism configured to move the cutting unit relative to the holding table.

The present invention produces an effect of enabling even a wafer cut along the outer peripheral edge of the wafer to be positioned in a predetermined orientation in a next step.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will hereinafter be described in detail with reference to the drawings. The present invention is not limited by contents described in the following embodiments. In addition, constituent elements described in the following include constituent elements readily conceivable by those skilled in the art and essentially identical constituent elements. Further, configurations described in the following can be combined with each other as appropriate. In addition, various omissions, replacements, or modifications of configurations can be performed without departing from the spirit of the present invention.

First Embodiment

Figure 1:
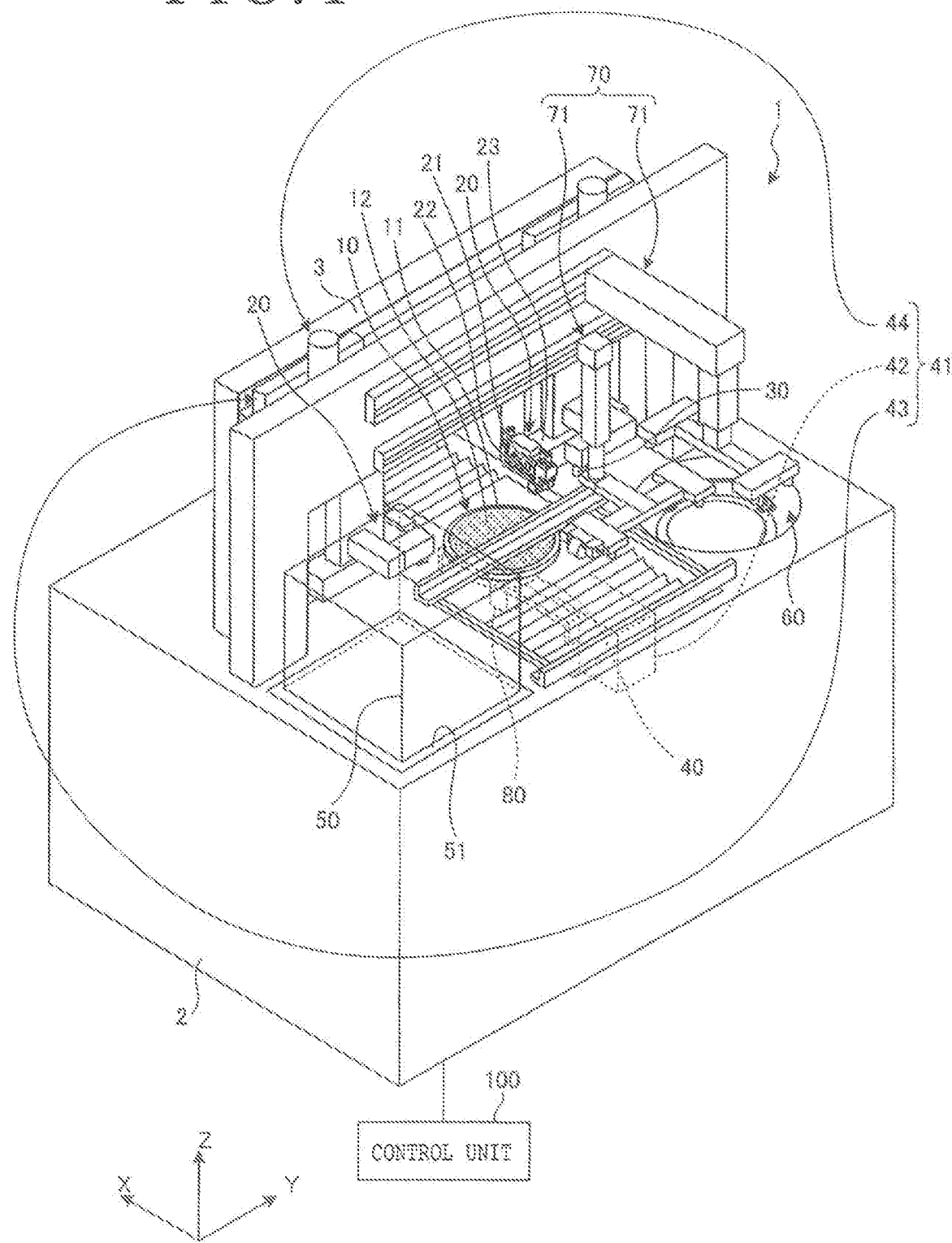
FIG. 1 is a perspective view depicting an example of a configuration of a cutting apparatus according to a first embodiment.
Figure 2:
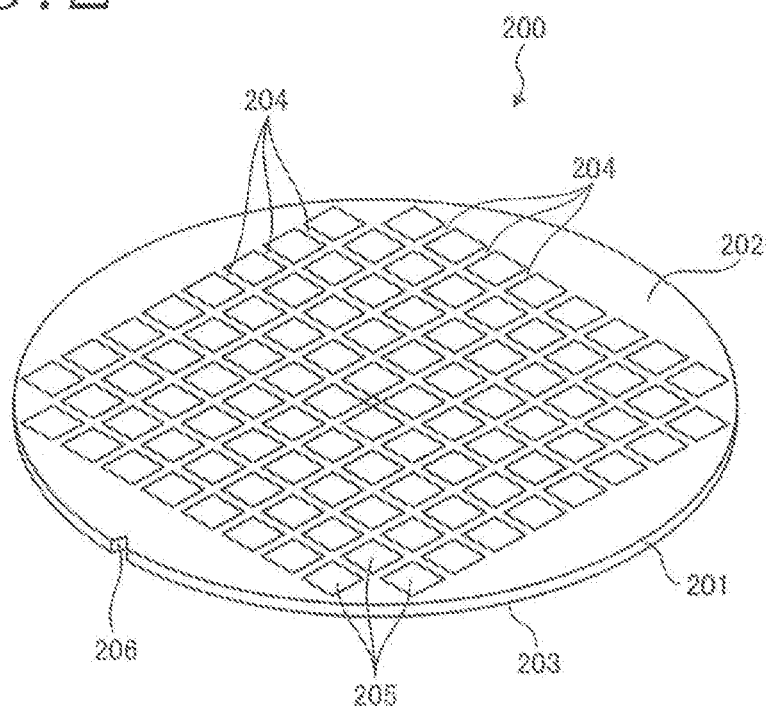
FIG. 2 is a perspective view of a wafer cut by the cutting apparatus depicted in FIG. 1.
Figure 3:
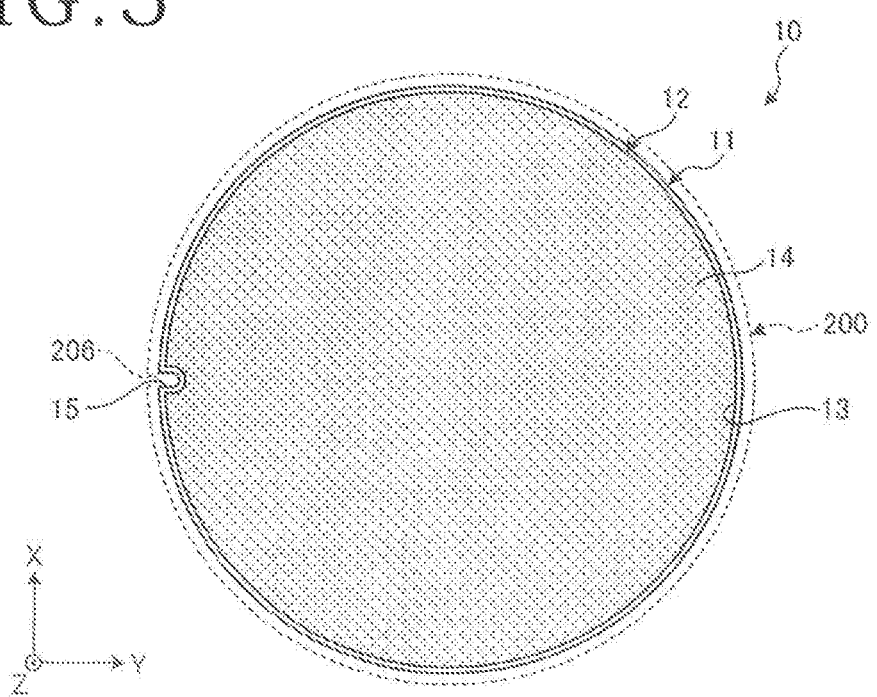
FIG. 3 is a plan view of a holding table of the cutting apparatus depicted in FIG. 1.

A cutting apparatus according to a first embodiment of the present invention will be described with reference to drawings. FIG. 1 is a perspective view depicting an example of a configuration of the cutting apparatus according to the first embodiment. FIG. 2 is a perspective view of a wafer cut by the cutting apparatus depicted in FIG. 1. FIG. 3 is a plan view of a holding table of the cutting apparatus depicted in FIG. 1.

A cutting apparatus 1 depicted in FIG. 1 according to the first embodiment is an apparatus that reduces the diameter of a wafer 200 by removing the entire circumference of an outer peripheral edge 201 of the wafer 200 depicted in FIG. 2 from a top surface 202 to an undersurface 203. In the first embodiment, the wafer 200 is a wafer such as a semiconductor wafer or an optical device wafer having a circular shape and using silicon, sapphire, gallium, or the like as a base material. The wafer 200 is formed in a disk shape and has devices 205 formed in regions demarcated in a lattice manner by a plurality of planned dividing lines 204 formed in a lattice manner on the top surface 202. In addition, the wafer 200 has a notch 206 as a notch portion formed by cutting away a part of an arc and indicating the crystal orientation of the base material. The notch 206 is formed by cutting away a part of the base material from the outer edge of the wafer 200 toward the center of the wafer 200.

The cutting apparatus 1 depicted in FIG. 1 is also an apparatus that reduces the diameter of the wafer 200 by cutting the wafer 200 along the outer peripheral edge 201 by a cutting blade 21. As depicted in FIG. 1, the cutting apparatus 1 includes a holding table 10 that sucks and holds the wafer 200 on a holding surface 14, cutting units 20 that cut the wafer 200 held by the holding table 10, an imaging unit 30 as imaging means that photographs the wafer 200 held by the holding table 10, and a control unit 100 as control means.

In addition, as depicted in FIG. 1, the cutting apparatus 1 includes a rotary moving unit 40 as a rotary mechanism that rotates the holding table 10 about a rotational axis parallel with a Z-axis direction along a vertical direction passing through the center of the holding surface 14, and a moving unit 41 as a moving mechanism that moves the cutting units 20 relative to the holding table 10.

The moving unit 41 includes an X-axis moving unit 42 that processing-feeds the holding table 10 in an X-axis direction parallel with a horizontal direction and the lateral direction of an apparatus main body 2, a Y-axis moving unit 43 that indexing-feeds the cutting units 20 in a Y-axis direction parallel with the horizontal direction and the longitudinal direction of the apparatus main body 2 and orthogonal to the X-axis direction, and a Z-axis moving unit 44 that cutting-feeds the cutting units 20 in a Z-axis direction parallel with the vertical direction orthogonal to both the X-axis direction and the Y-axis direction. The X-axis moving unit 42 processing-feeds the rotary moving unit 40 in the X-axis direction together with the holding table 10. As depicted in FIG. 1, the cutting apparatus 1 is what is called a facing dual type cutting apparatus having two cutting units 20, that is, a twin spindle dicer.

As depicted in FIG. 3, the holding table 10 includes a circular frame body 11 provided with a circular recessed portion 13 in a center thereof and a holding member 12 attached to the inside of the recessed portion 13 and formed of a porous material such as a porous ceramic. The holding table 10 is formed in a disk shape. The frame body 11 has a diameter corresponding to the diameter of the wafer 200 after the diameter reduction. Because the frame body 11 has a diameter corresponding to the diameter of the wafer 200 after the diameter reduction, the holding table 10 has a diameter corresponding to the diameter of the wafer 200 after the diameter reduction.

In the first embodiment, the diameter of the frame body 11 is slightly smaller than the diameter of the wafer 200 after the diameter reduction, that is, smaller than the diameter of the wafer 200 before the diameter reduction. The upper surface of the holding member 12 is the holding surface 14 that is formed in a circular shape and formed flush with the upper surface of the frame body 11, and which holds the wafer 200. That is, the holding table 10 includes the holding surface 14 in a circular shape. The recessed portion 13 in the holding table 10 is connected to a vacuum suction source not depicted and is sucked by the vacuum suction source. The holding table 10 thereby sucks and holds the wafer 200 mounted on the holding surface 14.

In addition, a blade clearance portion 15 corresponding to the notch 206 of the wafer 200 to be held is formed at the outer edge of the frame body 11 of the holding table 10. In the first embodiment, the blade clearance portion 15 is a recess extending from the outer edge of the frame body 11 toward the center of the frame body 11. The blade clearance portion 15 is formed such that a width thereof in the circumferential direction of the frame body 11 is larger than a maximum width of the notch 206. The blade clearance portion 15 is provided over an entire length in a thickness direction of the frame body 11. Incidentally, in the first embodiment, the blade clearance portion 15 is provided to both the frame body 11 and the holding member 12.

In addition, the holding table 10 is provided so as to be movable by the X-axis moving unit 42 along the X-axis direction and rotatable by the rotary moving unit 40 about a rotational axis. Incidentally, FIG. 3 indicates the wafer 200 before the diameter reduction by a dotted line.

The cutting units 20 cut (corresponding to processing) the wafer 200 held on the holding table 10. The cutting units 20 are each provided so as to be movable by the Y-axis moving unit 43 in the Y-axis direction with respect to the wafer 200 held on the holding table 10, and provided so as to be movable by the Z-axis moving unit 44 in the Z-axis direction with respect to the wafer 200 held on the holding table 10.

As depicted in FIG. 1, the pair of cutting units 20 is provided to a gate type supporting frame 3 erected from the apparatus main body 2 via the Y-axis moving unit 43, the Z-axis moving unit 44, and the like. The pair of cutting units 20 can position the cutting blades 21 at any position of the holding surface 14 of the holding table 10 by the Y-axis moving unit 43 and the Z-axis moving unit 44.

The pair of cutting units 20 includes a spindle housing 23 provided so as to be movable by the Y-axis moving unit 43 and the Z-axis moving unit 44 in the Y-axis direction and the Z-axis direction, a spindle 22 provided so as to be rotatable about an axis in the spindle housing 23 and rotated by a spindle motor, and mounted with the cutting blade 21 at an end of the spindle 22, and the cutting blade 21 that cuts the wafer 200 held on the holding table 10. The cutting blade 21 is a very thin cutting grindstone having substantially a ring shape. The axis of the spindle 22 and the cutting blade 21 of the cutting unit 20 is set parallel with the Y-axis direction.

The X-axis moving unit 42 processing-feeds the holding table 10 and the cutting unit 20 relative to each other along the X-axis direction by moving the holding table 10 in the X-axis direction as a processing feed direction. The Y-axis moving unit 43 indexing-feeds the holding table 10 and the cutting unit 20 relative to each other along the Y-axis direction by moving the cutting unit 20 in the Y-axis direction as an indexing feed direction. The Z-axis moving unit 44 cutting-feeds the holding table 10 and the cutting unit 20 relative to each other along the Z-axis direction by moving the cutting unit 20 in the Z-axis direction as a cutting feed direction.

The X-axis moving unit 42, the Y-axis moving unit 43, and the Z-axis moving unit 44 include a well-known ball screw provided rotatably about an axis, a well-known pulse motor rotating the ball screw about the axis, and well-known guide rails supporting the holding table 10 or the cutting unit 20 movably in the X-axis direction, the Y-axis direction, or the Z-axis direction.

In addition, the cutting apparatus 1 includes an X-axis direction position detecting unit not depicted for detecting the position in the X-axis direction of the holding table 10, a Y-axis direction position detecting unit not depicted for detecting the position in the Y-axis direction of the cutting unit 20, and a Z-axis direction position detecting unit for detecting the position in the Z-axis direction of the cutting unit 20. The X-axis direction position detecting unit and the Y-axis direction position detecting unit can include a linear scale parallel with the X-axis direction or the Y-axis direction and a read head. The Z-axis direction position detecting unit detects the position in the Z-axis direction of the cutting unit 20, on the basis of pulses of a pulse motor. The X-axis direction position detecting unit, the Y-axis direction position detecting unit, and the Z-axis direction position detecting unit output the position in the X-axis direction of the holding table 10 or in the Y-axis direction or the Z-axis direction of the cutting unit 20 to the control unit 100. Incidentally, in the first embodiment, each position is defined by distances in the X-axis direction, the Y-axis direction, and the Z-axis direction from a predetermined reference position.

In addition, the cutting apparatus 1 includes a cassette elevator 50 that is mounted with a cassette 51 housing the wafer 200 before and after cutting and moves the cassette 51 in the Z-axis direction, a cleaning unit 60 that cleans the wafer 200 after the cutting, and a transfer unit 70 that loads and unloads the wafer 200 into and from the cassette 51 and transfers the wafer 200. In the first embodiment, the transfer unit 70 includes a pair of transfer arms 71 that transfer the wafer 200.

The imaging unit 30 images the wafer 200 held on the holding surface 14 of the holding table 10. In the first embodiment, the imaging unit 30 is fixed to the cutting unit 20 so as to move integrally with the cutting unit 20. The imaging unit 30 includes an imaging element that images a region to be divided in the wafer 200 before the cutting that is held on the holding table 10. The imaging element is, for example, a charge-coupled device (CCD) imaging element or a complementary metal oxide semiconductor (CMOS) imaging element. The imaging unit 30 obtains an image for carrying out alignment that aligns the wafer 200 and the cutting blade 21 with each other, for example, by imaging the wafer 200 held on the holding table 10, and outputs the obtained image to the control unit 100.

In addition, the cutting apparatus 1 includes a second imaging unit 80 that images the wafer 200 carried out from the cassette 51. The second imaging unit 80 includes an imaging element that images a region including the notch 206 of the wafer 200 before the cutting that is held on the holding table 10. The imaging element is, for example, a CCD imaging element or a CMOS imaging element. The second imaging unit 80 obtains an image for detecting the position of the notch 206, for example, by imaging the wafer 200 taken out from the cassette 51 and outputs the obtained image to the control unit 100.

The control unit 100 makes the cutting apparatus 1 perform processing operation on the wafer 200 by controlling each of the above-described units of the cutting apparatus 1. Incidentally, the control unit 100 is a computer including an arithmetic processing apparatus having a microprocessor such as a central processing unit (CPU), a storage apparatus having a memory such as a read only memory (ROM) or a random access memory (RAM), and an input-output interface apparatus. The arithmetic processing apparatus of the control unit 100 performs arithmetic processing according to a computer program stored in the storage apparatus and outputs a control signal for controlling the cutting apparatus 1 to the above-described constituent elements of the cutting apparatus 1 via the input-output interface apparatus.

In addition, the control unit 100 is connected with a display unit not depicted that includes a liquid crystal display apparatus or the like displaying the state of the processing operation, an image, or the like, and an input unit used when an operator registers processing content information or the like. The input unit includes at least one of a touch panel provided to the display unit and an external input apparatus such as a keyboard.

(Wafer Processing Method)

Figure 4:
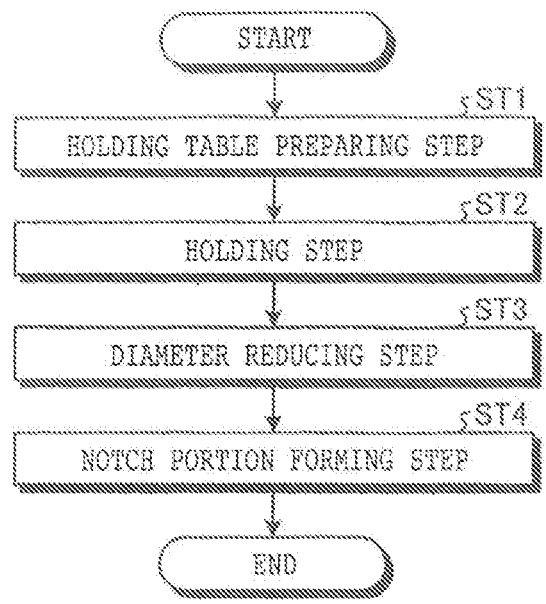
FIG. 4 is a flowchart depicting a flow of a wafer processing method according to the first embodiment.

A wafer processing method according to the first embodiment of the present invention will be described with reference to drawings. FIG. 4 is a flowchart depicting a flow of the wafer processing method according to the first embodiment. The wafer processing method according to the first embodiment is a method of reducing the diameter of the wafer 200 by cutting the wafer 200 along the outer peripheral edge 201 by the cutting blade 21. As depicted in FIG. 4, the wafer processing method includes a holding table preparing step ST1, a holding step ST2, a diameter reducing step ST3, and a notch portion forming step ST4.

(Holding Table Preparing Step)

The holding table preparing step ST1 is a step of preparing the above-described holding table 10. In the holding table preparing step ST1, the above-described holding table 10 is prepared, and the holding table 10 is attached to the rotary moving unit 40. In addition, in the holding table preparing step ST1 in the first embodiment, the operator registers processing content information in the control unit 100 and mounts the cassette 51 housing wafers 200 on the cassette elevator 50. The wafer processing method then proceeds to the holding step ST2.

(Holding Step)

Figure 5:
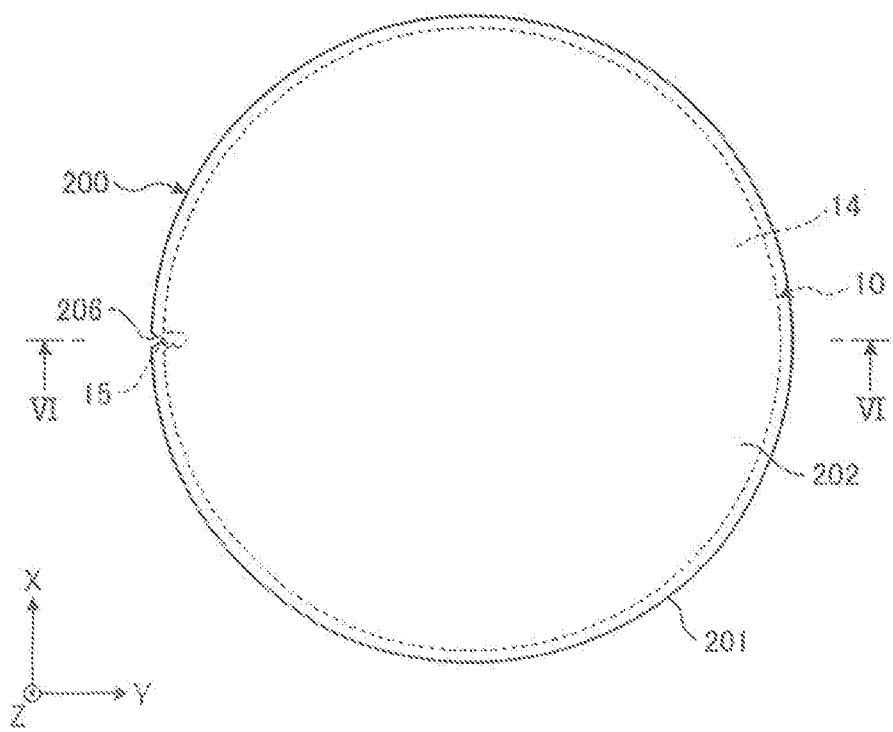
FIG. 5 is a plan view of the holding table, the plan view depicting a holding step of the wafer processing method depicted in FIG. 4.
Figure 6:
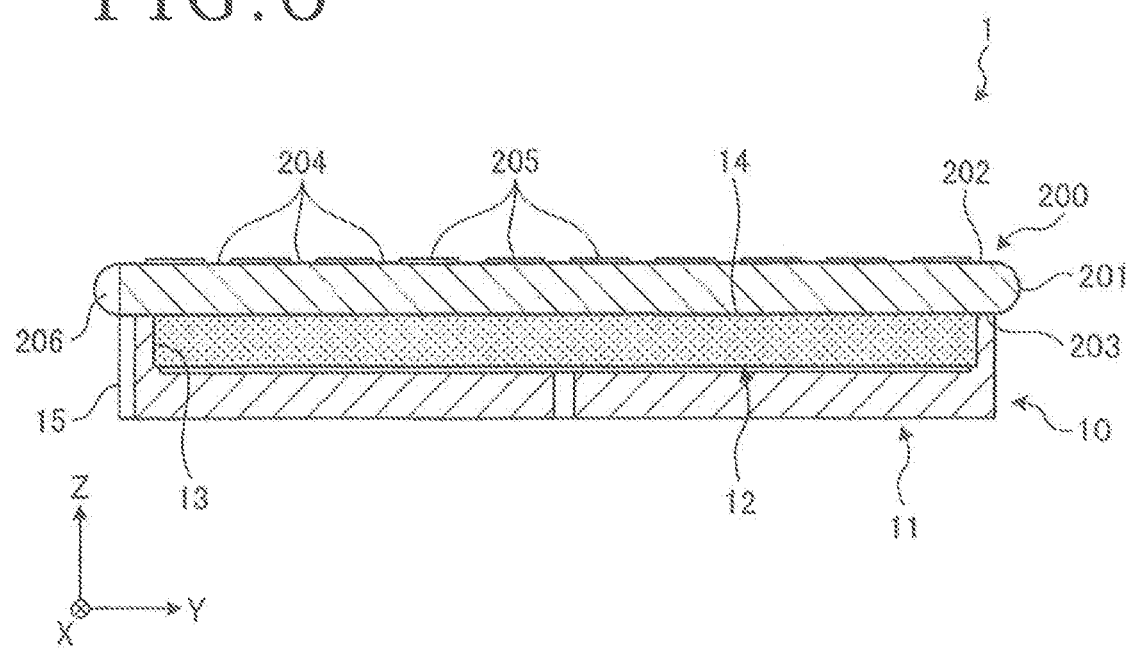
FIG. 6 is a sectional view taken along a line VI-VI in FIG. 5.

FIG. 5 is a plan view of the holding table, the plan view depicting the holding step of the wafer processing method depicted in FIG. 4. FIG. 6 is a sectional view taken along a line VI-VI in FIG. 5. The holding step ST2 is a step of holding the wafer 200 on the holding table 10 so as to make the notch 206 of the wafer 200 correspond to the blade clearance portion 15 of the holding table 10 after the holding table preparing step ST1.

In the holding step ST2 in the first embodiment, when the cutting apparatus 1 receives an instruction to start processing operation from the operator, the cutting apparatus 1 takes out one wafer 200 from the inside of the cassette 51 by controlling the transfer unit 70. In the holding step ST2 in the first embodiment, the cutting apparatus 1 detects the notch 206, on the basis of an image obtained by imaging the wafer 200 by the second imaging unit 80, and mounts the undersurface 203 side of the wafer 200 on the holding surface 14 as depicted in FIG. 5 and FIG. 6 such that the wafer 200 and the holding surface 14 are positioned coaxially with each other and the blade clearance portion 15 and the notch 206 are aligned with each other in a radial direction, by controlling one of the transfer unit 70 and the rotary moving unit 40. In the holding step ST2, the cutting apparatus 1 sucks and holds the undersurface 203 side on the holding surface 14 of the holding table 10. The wafer processing method then proceeds to the diameter reducing step ST3. Incidentally, FIG. 5 omits the planned dividing lines 204 and the devices 205.

(Diameter Reducing Step)

Figure 7:
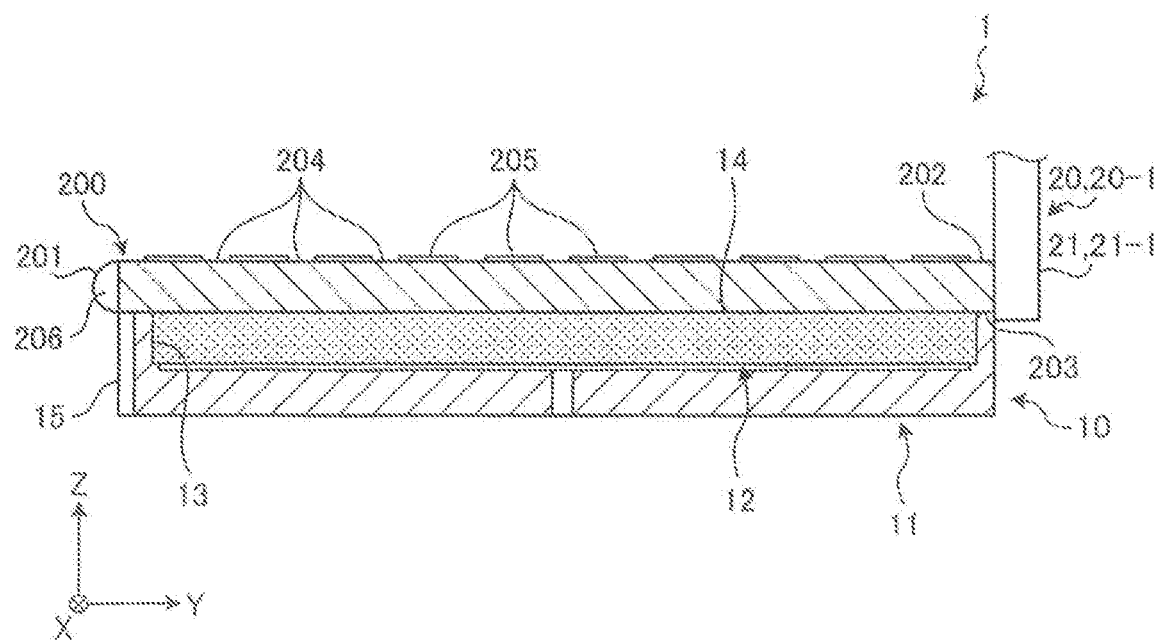
FIG. 7 is a sectional view depicting a diameter reducing step of the wafer processing method depicted in FIG. 4.

FIG. 7 is a sectional view depicting the diameter reducing step of the wafer processing method depicted in FIG. 4. The diameter reducing step ST3 is a step of reducing the diameter of the wafer 200 by cutting the wafer 200 by the cutting blade 21 along the outer peripheral edge 201 of the wafer 200 in a state in which an end of the cutting blade 21 is positioned below the holding surface 14 of the holding table 10, and thereby removing at least a part of the notch 206, after the holding step ST2 is performed.

In the diameter reducing step ST3, by controlling the moving unit 41, the cutting apparatus 1 positions a lower end as an end of the cutting edge of the cutting blade 21 being rotated (hereinafter indicated by a reference sign 21-1) in one cutting unit 20 (hereinafter indicated by a reference sign 20-1) below the holding surface 14 of the holding table 10. In the diameter reducing step ST3, by controlling the moving unit 41, the cutting apparatus 1 positions the lower end as the end of the cutting edge of the cutting blade 21-1 of the one cutting unit 20-1 at a position aligned in the X-axis direction with the outer peripheral edge 201 of the wafer 200 protruding from the outer edge of the holding table 10, and thereafter moves the holding table 10 in a direction of approaching the one cutting unit 20-1 along the X-axis direction. As depicted in FIG. 7, the cutting apparatus 1 thereby makes the cutting edge of the cutting blade 21-1 cut into the outer peripheral edge 201 of the wafer 200.

In the diameter reducing step ST3, after the cutting apparatus 1 makes the cutting edge of the cutting blade 21-1 cut into the outer peripheral edge 201 of the wafer 200, the cutting apparatus 1 rotates the holding table 10 about the rotational axis, and thus moves the cutting blade 21-1 relative to the wafer 200 along the outer peripheral edge 201. In the diameter reducing step ST3, the cutting apparatus 1 reduces the diameter of the wafer 200 by removing the outer peripheral edge 201 over the entire circumference. The wafer processing method then proceeds to the notch portion forming step ST4. In the diameter reducing step ST3 in the first embodiment, the cutting apparatus 1 removes the whole of the notch 206. In the present invention, however, a part of the notch 206 may be left in the wafer 200. Incidentally, the thickness of the cutting edge of the cutting blade 21-1 that removes the outer peripheral edge 201 of the wafer 200 in the diameter reducing step ST3 is equal to the width of the outer peripheral edge 201 removed from the wafer 200.

(Notch Portion Forming Step)

Figure 8:
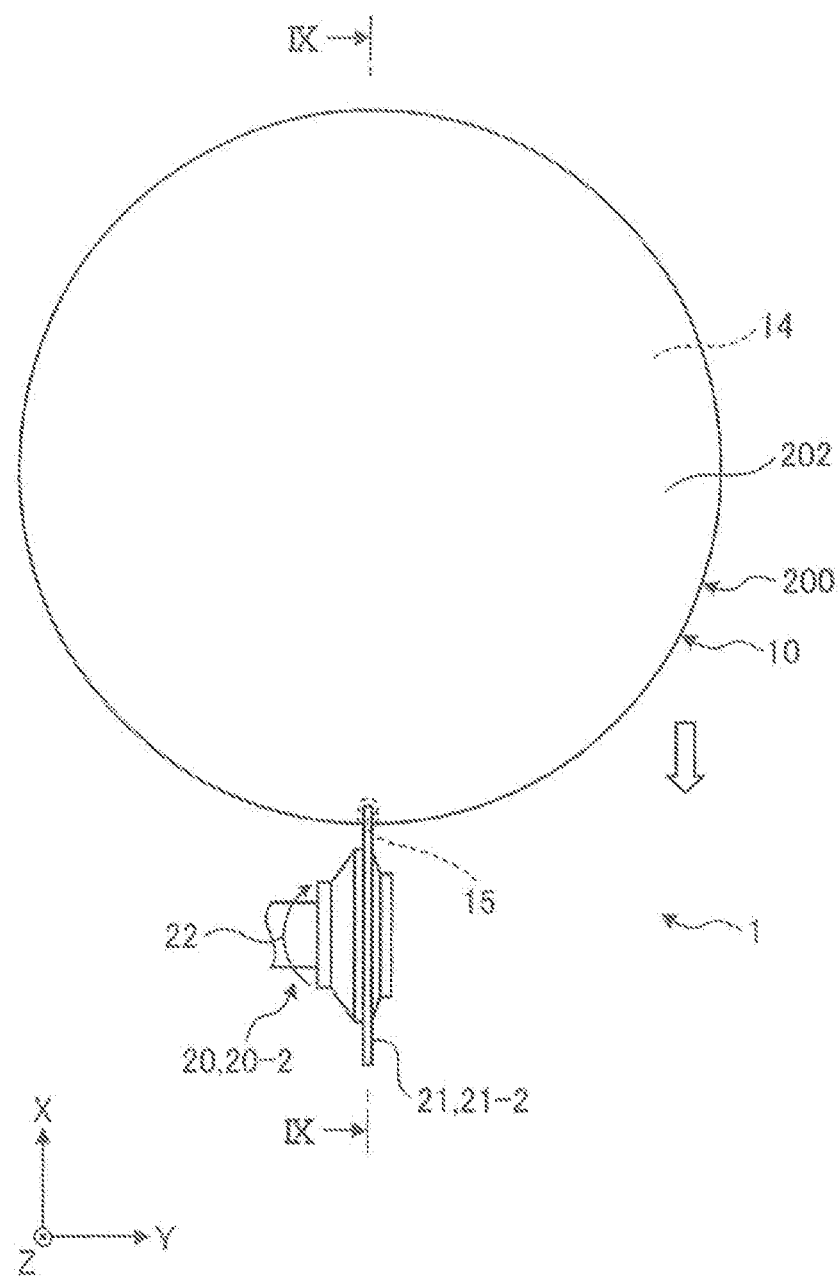
FIG. 8 is a plan view depicting a notch portion forming step of the wafer processing method depicted in FIG. 4.
Figure 9:
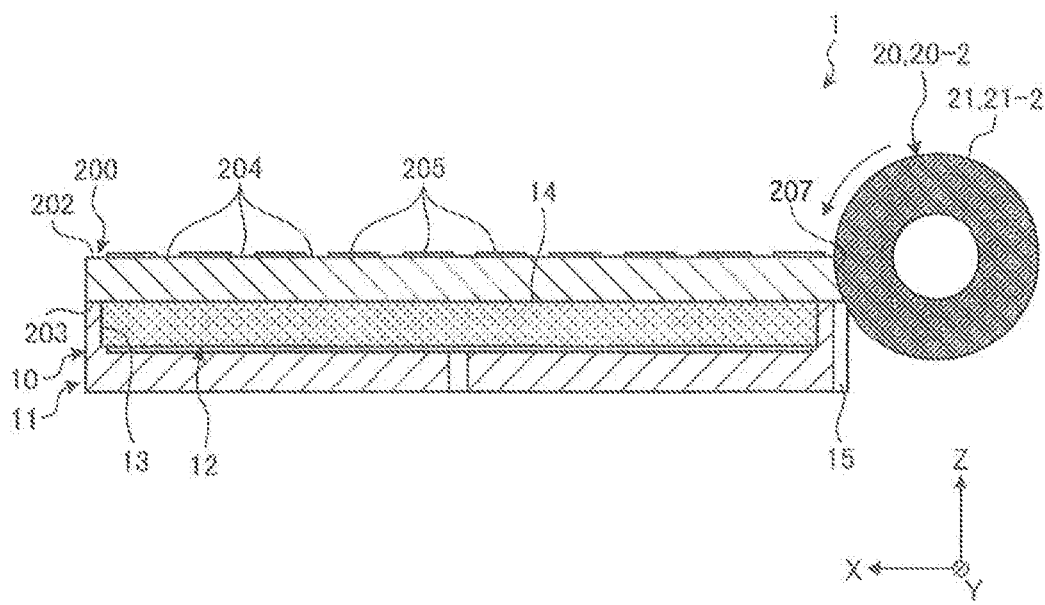
FIG. 9 is a sectional view taken along a line IX-IX in FIG. 8.

FIG. 8 is a plan view depicting the notch portion forming step of the wafer processing method depicted in FIG. 4. FIG. 9 is a sectional view taken along a line IX-IX in FIG. 8. The notch portion forming step ST4 is a step of forming a second notch 207 as a notch portion in the wafer 200 by cutting the wafer 200 in a thickness direction by the cutting blade 21 along the blade clearance portion 15 of the holding table 10.

In the notch portion forming step ST4, the cutting apparatus 1 positions the blade clearance portion 15 at an end in the X-axis direction of the holding table 10 by controlling the rotary moving unit 40, and opposes the cutting edge of the cutting blade 21 being rotated (hereinafter indicated by a reference sign 21-2) in the other cutting unit 20 (hereinafter indicated by a reference sign 20-2) to the blade clearance portion 15 in the X-axis direction by controlling the moving unit 41. In addition, in the notch portion forming step ST4, the cutting apparatus 1 positions a lower end as an end of the cutting blade 21-2 below the holding surface 14 of the holding table 10 by controlling the moving unit 41. In the notch portion forming step ST4, the cutting apparatus 1 moves the holding table 10 in a direction of approaching the other cutting unit 20-2 along the X-axis direction by controlling the moving unit 41. As depicted in FIG. 8 and FIG. 9, the cutting apparatus 1 thereby makes the cutting edge of the cutting blade 21-2 cut into the outer edge of the wafer 200 and makes the cutting blade 21-2 enter the inside of the blade clearance portion 15.

In the notch portion forming step ST4, after the cutting apparatus 1 forms the second notch 207 by making the cutting edge of the cutting blade 21-2 cut into the outer edge of the wafer 200, the cutting apparatus 1 moves the holding table 10 away from the cutting unit 20-2 by controlling the moving unit 41. As with the notch 206, the second notch 207 is a notch portion indicating the crystal orientation of the base material and indicates the crystal orientation in the same direction as the notch 206. The second notch 207 is a groove formed by cutting away a part of the base material from the outer edge of the wafer 200 toward the center of the wafer 200.

In the notch portion forming step ST4, the cutting apparatus 1 stops the sucking and holding of the holding table 10 and transfers the wafer 200 to the cleaning unit 60 by controlling the transfer unit 70. In the notch portion forming step ST4, the cutting apparatus 1 cleans the wafer 200 by controlling the cleaning unit 60 and carries the wafer 200 into the cassette 51 by controlling the transfer unit 70. The cutting apparatus 1 then ends the wafer processing method. Incidentally, the thickness of the cutting edge of the cutting blade 21-2 that cuts into the outer edge of the wafer 200 in the notch portion forming step ST4 is smaller than that of the cutting edge of the cutting blade 21-1 of the one cutting unit 20. Incidentally, FIG. 8 omits the planned dividing lines 204 and the devices 205.

The wafer processing method and the cutting apparatus 1 according to the foregoing first embodiment prepare the holding table 10 in which the blade clearance portion 15 is formed so as to correspond to the notch 206 of the wafer 200. The wafer processing method and the cutting apparatus 1 align the notch 206 of the wafer 200 and the blade clearance portion 15 with each other in the radial direction and hold the wafer 200 so as to make the notch 206 correspond to the blade clearance portion 15 of the holding table 10. The wafer processing method and the cutting apparatus 1 cut the wafer 200 along the outer peripheral edge 201 and cut the wafer 200 along the blade clearance portion 15 in a state in which the wafer 200 is held on the holding table 10. The wafer processing method and the cutting apparatus 1 therefore form the new second notch 207 in the wafer 200 reduced in diameter, the new second notch 207 indicating the same crystal orientation as the notch 206 of the wafer 200 before the diameter reduction. Thus, the wafer processing method and the cutting apparatus 1 enable the crystal orientation of the wafer 200 reduced in diameter to be detected, and thus enable the wafer 200 reduced in diameter to be positioned in a predetermined orientation in a next step. As a result, the wafer processing method and the cutting apparatus 1 produce an effect of enabling even the wafer 200 cut along the outer peripheral edge 201 to be positioned in the predetermined orientation in the next step.

Second Embodiment

Figure 10:
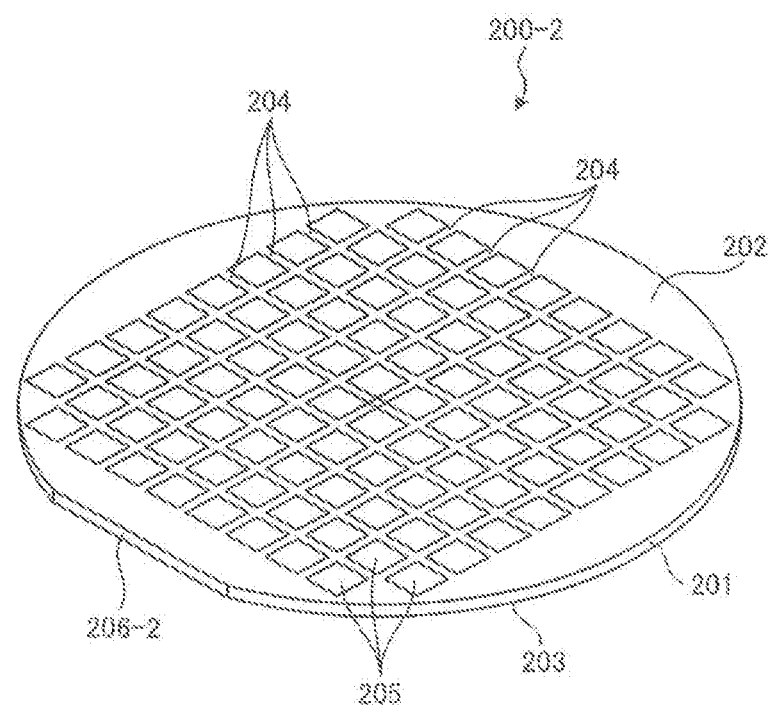
FIG. 10 is a perspective view of a wafer cut by a wafer processing method and a cutting apparatus according to a second embodiment.
Figure 11:
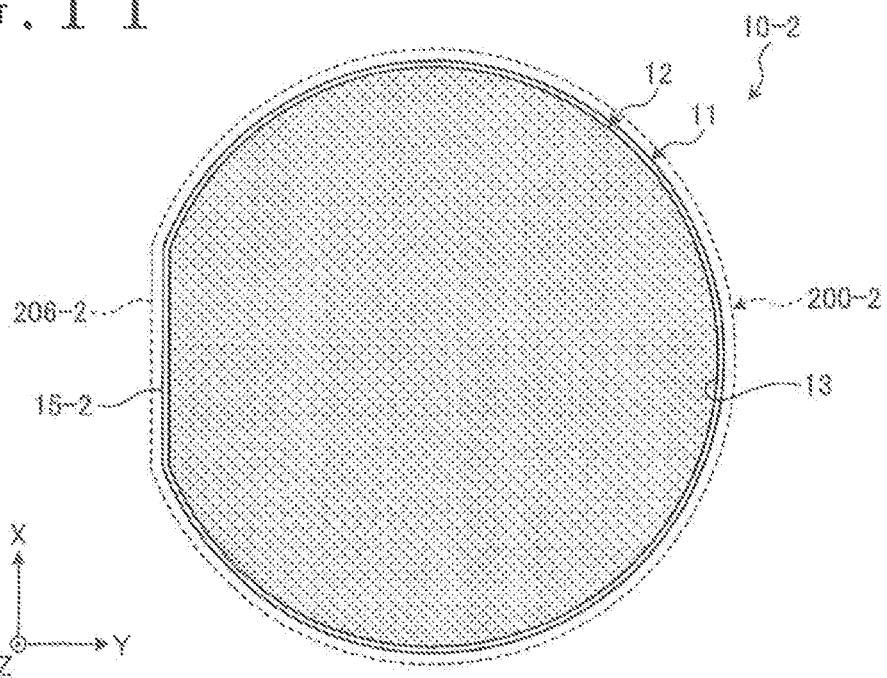
FIG. 11 is a plan view of a holding table of the cutting apparatus according to the second embodiment.
Figure 12:
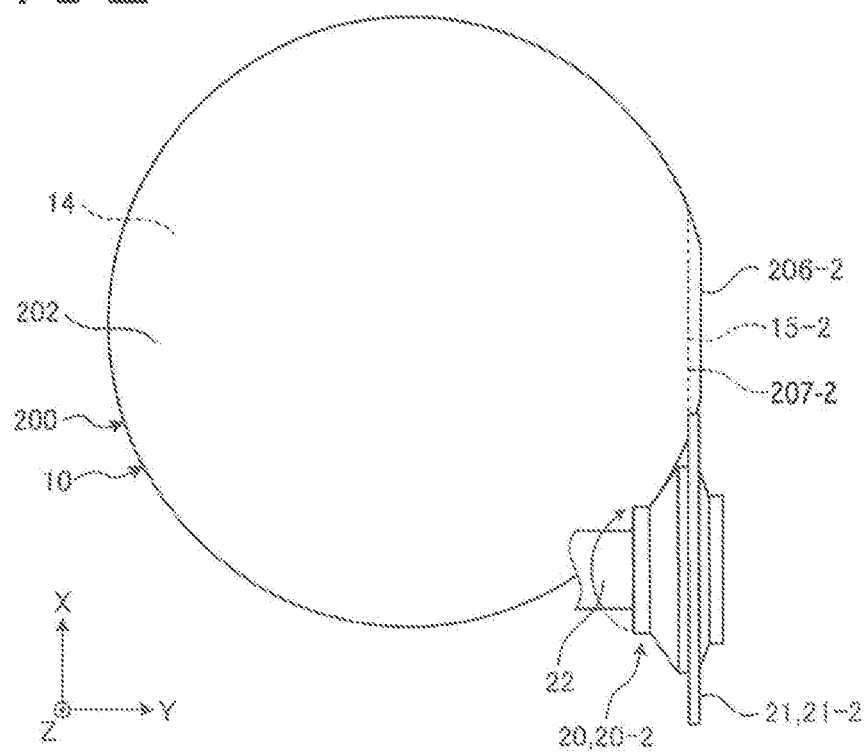
FIG. 12 is a plan view depicting a notch portion forming step of the wafer processing method according to the second embodiment.

A wafer processing method and a cutting apparatus according to a second embodiment of the present invention will be described with reference to drawings. FIG. 10 is a perspective view of a wafer to be cut by the wafer processing method and the cutting apparatus according to the second embodiment. FIG. 11 is a plan view of a holding table of the cutting apparatus according to the second embodiment. FIG. 12 is a plan view depicting a notch portion forming step of the wafer processing method according to the second embodiment. In FIG. 10, FIG. 11, and FIG. 12, the same parts as in the first embodiment are identified by the same reference signs, and description thereof will be omitted.

As depicted in FIG. 10, a wafer 200-2 to be cut by the wafer processing method and the cutting apparatus 1 according to the second embodiment has an orientation flat 206-2 as a notch portion indicating the crystal orientation of a base material in place of the notch 206. The orientation flat 206-2 is linearly formed by cutting away a part of an arc of the wafer 200-2.

As depicted in FIG. 11, a blade clearance portion 15-2 corresponding to the orientation flat 206-2 of the wafer 200-2 to be held is formed at the outer edge of the frame body 11 in a holding table 10-2 of the cutting apparatus 1 according to the second embodiment. In the second embodiment, the blade clearance portion 15-2 is linearly formed at the outer edge of the frame body 11 and is provided over an entire length in the thickness direction of the frame body 11. Incidentally, in the second embodiment, the blade clearance portion 15-2 is provided to both the frame body 11 and the holding member 12. Incidentally, FIG. 11 indicates the wafer 200-2 before diameter reduction by a dotted line.

The holding table preparing step ST1 of the wafer processing method according to the second embodiment is performed in a similar manner to the first embodiment. In the holding step ST2 of the wafer processing method according to the second embodiment, the cutting apparatus 1 detects the orientation flat 206-2, on the basis of an image obtained by imaging the wafer 200-2 by the second imaging unit 80, and by controlling one of the transfer unit 70 and the rotary moving unit 40, the cutting apparatus 1 mounts the undersurface 203 side of the wafer 200-2 on the holding surface 14 as depicted in FIG. 11 such that the wafer 200-2 and the holding surface 14 are positioned coaxially with each other and the blade clearance portion 15-2 and the orientation flat 206-2 are parallel with each other, and sucks and holds the undersurface 203 side of the wafer 200-2 on the holding surface 14 of the holding table 10-2.

The diameter reducing step ST3 of the wafer processing method according to the second embodiment is performed in a similar manner to the first embodiment. In the notch portion forming step ST4 of the wafer processing method according to the second embodiment, the cutting apparatus 1 positions the blade clearance portion 15-2 and the orientation flat 206-2 in parallel with the X-axis direction by controlling the rotary moving unit 40, and opposes, in the X-axis direction, the cutting edge of the cutting blade 21-2 being rotated in the other cutting unit 20-2 to a part of the wafer 200-2 that protrudes from the blade clearance portion 15-2 by controlling the moving unit 41.

In addition, in the notch portion forming step ST4 of the wafer processing method according to the second embodiment, the cutting apparatus 1 positions a lower end as an end of the cutting blade 21-2 below the holding surface 14 of the holding table 10-2 by controlling the moving unit 41. In the notch portion forming step ST4 of the wafer processing method according to the second embodiment, the cutting apparatus 1 moves the holding table 10-2 in a direction of approaching the other cutting unit 20-2 along the X-axis direction by controlling the moving unit 41. As depicted in FIG. 12, the cutting apparatus 1 thereby makes the cutting edge of the cutting blade 21-2 cut into the outer edge of the wafer 200-2 and moves the cutting blade 21-2 relative to the holding table 10-2 along the blade clearance portion 15-2.

In the notch portion forming step ST4, after the cutting apparatus 1 cuts the wafer 200-2 by making the cutting blade 21-2 cut into the outer edge of the wafer 200-2 and thus forms a second orientation flat 207-2 as a notch portion, the cutting apparatus 1 moves the holding table 10-2 away from the cutting unit 20-2 by controlling the moving unit 41. The cutting apparatus 1 then ends the wafer processing method similarly to the first embodiment. As with the orientation flat 206-2, the second orientation flat 207-2 is a notch portion indicating the crystal orientation of the base material and indicates the crystal orientation in the same direction as the orientation flat 206-2. The second orientation flat 207-2 is linearly formed by cutting away a part of an arc of the wafer 200-2.

The wafer processing method and the cutting apparatus 1 according to the foregoing second embodiment prepare the holding table 10-2 in which the blade clearance portion 15-2 is formed so as to correspond to the orientation flat 206-2 of the wafer 200-2, position the orientation flat 206-2 and the blade clearance portion 15-2 in parallel with each other, and hold the wafer 200-2. The wafer processing method and the cutting apparatus 1 cut the wafer 200-2 along the outer peripheral edge 201 and cut the wafer 200-2 along the blade clearance portion 15-2 in a state in which the wafer 200-2 is held on the holding table 10-2. The wafer processing method and the cutting apparatus 1 therefore form the new second orientation flat 207-2 in the wafer 200-2 reduced in diameter, the new second orientation flat 207-2 indicating the same crystal orientation as the orientation flat 206-2 of the wafer 200-2 before the diameter reduction. Thus, the wafer processing method and the cutting apparatus 1 enable the crystal orientation of the wafer 200-2 reduced in diameter to be detected, and thus enable the wafer 200-2 reduced in diameter to be positioned in a predetermined orientation in a next step. As a result, the wafer processing method and the cutting apparatus 1 produce an effect of enabling even the wafer 200-2 cut along the outer peripheral edge 201 to be positioned in the predetermined orientation in the next step.

It is to be noted that the present invention is not limited to the foregoing embodiments. That is, the present invention can be modified and carried out in various manners without departing from the gist of the present invention. For example, the wafer processing method according to the present invention may perform the notch portion forming step ST4 before the diameter reducing step ST3. In addition, in the holding step ST2 of the present invention, the operator may manually position and mount the wafer 200 or 200-2 on the holding surface 14 of the holding table 10 or 10-2 as in the first embodiment and the second embodiment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for reducing a diameter of a wafer forming a circular shape and having a first notch portion formed by cutting away a part of an arc, the first notch portion indicating a crystal orientation, by cutting the wafer along an outer peripheral edge of the wafer by a cutting blade, the wafer processing method comprising:
   a holding table preparing step of preparing a holding table having a circular holding surface configured to hold the wafer and having a blade clearance portion formed in the holding table so as to correspond to the first notch portion of the wafer to be held;
   a holding step of holding the wafer by the holding table so as to make the first notch portion of the wafer correspond to the blade clearance portion of the holding table, after the holding table preparing step, the holding surface of the holding table having a diameter corresponding to the diameter of the wafer after diameter reduction;
   a diameter reducing step of reducing the diameter of the wafer by cutting the wafer by the cutting blade along the outer peripheral edge of the wafer in a state in which an end of the cutting blade is positioned below the holding surface of the holding table and therefore removing at least a part of the first notch portion, after the holding step is performed; and
   a notch portion forming step of forming a second notch portion in the wafer by cutting the wafer in a thickness direction by the cutting blade along the blade clearance portion of the holding table.

2. A cutting apparatus for reducing a diameter of a wafer forming a circular shape and having a notch portion formed by cutting away a part of an arc, the notch portion indicating a crystal orientation, by cutting the wafer by a cutting blade along an outer peripheral edge of the wafer, the cutting apparatus comprising:
   a holding table having a circular holding surface configured to hold the wafer, having a blade clearance portion formed in the holding table so as to correspond to the notch portion of the wafer to be held, and having a diameter corresponding to the diameter of the wafer after diameter reduction;
   a rotary mechanism configured to rotate the holding table about a rotational axis passing through a center of the holding surface;
   a cutting unit including the cutting blade configured to cut the wafer held on the holding table and a spindle having the cutting blade mounted on an end of the spindle; and
   a moving mechanism configured to move the cutting unit relative to the holding table.

* * * * *